(12) United States Patent
Liu et al.

(10) Patent No.: US 10,629,834 B2
(45) Date of Patent: Apr. 21, 2020

(54) THIN FILM TRANSISTOR, METHOD FOR PREPARING THE SAME, AND DISPLAY DEVICE

(71) Applicant: BOE TECHNOLOGY GROUP CO., LTD., Beijing (CN)

(72) Inventors: Song Liu, Beijing (CN); Yu Wen, Beijing (CN); Jianming Sun, Beijing (CN); Zhengliang Li, Beijing (CN); Xiaochen Ma, Beijing (CN); Hehe Hu, Beijing (CN); Wenlin Zhang, Beijing (CN); Jianhua Du, Beijing (CN); Ce Ning, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/115,009

(22) Filed: Aug. 28, 2018

(65) Prior Publication Data

US 2019/0267559 A1 Aug. 29, 2019

(30) Foreign Application Priority Data

Feb. 28, 2018 (CN) .......................... 2018 1 0166196

(51) Int. Cl.
    *H01L 51/42*     (2006.01)
    *H01L 51/44*     (2006.01)
    *H01L 29/786*     (2006.01)
    *H01L 51/05*     (2006.01)

(52) U.S. Cl.
CPC ........ *H01L 51/428* (2013.01); *H01L 51/4213* (2013.01); *H01L 51/441* (2013.01); *H01L 29/786* (2013.01); *H01L 51/0512* (2013.01); *Y02E 10/549* (2013.01)

(58) Field of Classification Search
CPC . H01L 29/4908; H01L 29/66742–6678; H01L 29/786–78696; H01L 27/12–13; H01L 2924/13069; H01L 51/0508–057
See application file for complete search history.

(56) References Cited

U.S. PATENT DOCUMENTS

2004/0085598 A1* 5/2004 Kokeguchi ............. H01L 27/30
                                                        348/333.01
2010/0283042 A1* 11/2010 Katz .................... H01L 51/0053
                                                        257/40
2018/0096797 A1* 4/2018 Satou .................... H01G 9/0029
2019/0157321 A1* 5/2019 Niimi .................... H01L 29/786

* cited by examiner

*Primary Examiner* — Julia Slutsker
(74) *Attorney, Agent, or Firm* — Kinney & Lange, P.A.

(57) ABSTRACT

The present disclosure relates to the field of display, in particular to a thin film transistor, a method for preparing the same, and a display device. The thin film transistor of the present disclosure includes a gate electrode, a gate insulating layer, a semiconductor layer, a source electrode, a drain electrode, and a photoelectric conversion layer in contact with the gate electrode. The photoelectric conversion layer is configured to generate an induced potential in a light environment.

19 Claims, 2 Drawing Sheets

THIN FILM TRANSISTOR, METHOD FOR PREPARING THE SAME, AND DISPLAY DEVICE

CROSS-REFERENCE TO RELATED APPLICATION

This application claims a priority to Chinese Patent Application No. 201810166196.X filed on Feb. 28, 2018, the disclosures of which are incorporated in their entirety by reference herein.

BACKGROUND

The present disclosure relates to the field of display, in particular to a thin film transistor, a method for preparing the same, and a display device.

Thin film transistor is a field effect semiconductor device, and plays an important role especially in a flat panel display device. The thin film transistor includes several important components, such as a base, a gate electrode, a gate insulating layer, a semiconductor layer, a source electrode and a drain electrode. According to the relative position of the gate electrode to the semiconductor layer, it may be specifically classified into a thin film transistor with a top gate structure and a thin film transistor with a bottom gate structure. With the development of display technology toward a high resolution, a large size, and a high frame rate, there is a higher demand for the drive capability of the thin film transistor.

Currently, the thin film transistor is driven by a gate voltage, thereby turning on a channel and the thin film transistor. However, since the gate insulating layer is too thick, the capacitance of a passivation layer is too small, and a voltage of above 1 V is required in order to turn on the thin film transistor.

SUMMARY

The present disclosure provides a thin film transistor, a method for preparing the same, and a display device.

In one aspect, the present disclosure provides a thin film transistor, including a gate electrode, a gate insulating layer, a semiconductor layer, a source electrode, a drain electrode, and a photoelectric conversion layer in contact with the gate electrode, wherein the photoelectric conversion layer is configured to generate an induced potential in a light environment.

Optionally, the thin film transistor is a thin film transistor with a bottom gate structure, and the photoelectric conversion layer includes a transparent conductive layer, an electron transport layer, and a photosensitive layer which are arranged in sequence, and the photosensitive layer is in contact with the gate electrode.

Optionally, the thin film transistor is a thin film transistor with a top gate structure, and the photoelectric conversion layer includes a photosensitive layer, an electron transport layer, and a transparent conductive layer which are arranged in sequence, and the photosensitive layer is in contact with the gate electrode.

Optionally, the photosensitive layer is made of a material having a general formula $ABX_3$, in which A is $CH_3NH_3$, B is a metal element, and X is a halogen.

Optionally, the photosensitive layer is made of a material having a general formula $ABX_3$, in which A is $CH_3NH_3$, B is a metal element in group IVA, and X is a halogen.

Optionally, the photosensitive layer is made of a material having a general formula $CH_3NH_3PbX_3$, in which X is a halogen.

Optionally, the gate insulating layer has a unit capacitance of above 15 $nF/cm^2$.

Optionally, the gate insulating layer is made of a silica solid electrolyte or an alumina solid electrolyte.

Optionally, the photosensitive layer has a thickness of 300 nm to 500 nm, the electron transport layer has a thickness of 500 nm to 1 μm, and the transparent conductive layer has a thickness of 100 nm to 200 nm.

Optionally, the thin film transistor further includes an interlayer insulating layer arranged on the photoelectric conversion layer, the source electrode and the drain electrode being arranged on the interlayer insulating layer.

In another aspect, the present disclosure provides a method for preparing a thin film transistor, including steps of forming a gate electrode, a gate insulating layer, a semiconductor layer, a source electrode, a drain electrode, and a photoelectric conversion layer in contact with the gate electrode on a base substrate.

Optionally, the thin film transistor is a thin film transistor with a bottom gate structure and the step of forming the photoelectric conversion layer in contact with the gate electrode includes: forming a transparent conductive layer on the base substrate; depositing an electron transport layer on a surface of the transparent conductive layer; forming a photosensitive layer on a surface of the electron transport layer; and patterning the transparent conductive layer, the electron transport layer and the photosensitive layer, to obtain the photoelectric conversion layer.

Optionally, the thin film transistor is a thin film transistor with a top gate structure, and the step of forming the photoelectric conversion layer in contact with the gate electrode includes: forming a photosensitive layer on a surface of the gate electrode; depositing an electron transport layer on a surface of the photosensitive layer; depositing a transparent conductive layer on a surface of the electron transport layer; and patterning the transparent conductive layer, the electron transport layer and the photosensitive layer, to obtain the photoelectric conversion layer.

Optionally, the step of forming the photosensitive layer includes: forming a solution containing a material having a general formula $ABX_3$ on a surface of the electron transport layer or the gate electrode through spinning, to obtain the photosensitive layer after drying, wherein A is $CH_3NH_3$, B is a metal element, and X is a halogen.

Optionally, the step of forming the photosensitive layer includes: forming a solution containing a material having a general formula $ABX_3$ on a surface of the electron transport layer or the gate electrode through spinning, to obtain the photosensitive layer after drying, wherein A is $CH_3NH_3$, B is a metal element in group IVA, and X is a halogen.

Optionally, the step of forming the photosensitive layer includes: forming a solution containing a material having a general formula $ABX_3$ on a surface of the electron transport layer or the gate electrode through spinning, to obtain the photosensitive layer after drying, wherein A is $CH_3NH_3$, B is Pb, and X is a halogen.

Optionally, the step of forming the gate insulating layer includes: depositing a silicon dioxide solid electrolyte on the base substrate, on which the gate electrode or the semiconductor layer is formed, through vapor deposition, to obtain the gate insulating layer. In the vapor deposition, a gas flow ratio of $SiH_4$ to $O_2$ is from 1:4 to 1:5.

In still another aspect, the present disclosure provides a display device including the thin film transistor described in the above technical solutions.

DETAILED DESCRIPTION

In order to better understand the present disclosure, the optional embodiments of the present disclosure will be described below in combination with examples, but it should be understood that these descriptions are merely used to further illustrate the features and advantages of the present disclosure and are not intended to limit the present disclosure.

One embodiment of the present discloses a thin film transistor, including a gate electrode, a gate insulating layer, a semiconductor layer, a source electrode, a drain electrode and a photoelectric conversion layer in contact with the gate electrode, wherein the photoelectric conversion layer is configured to generate an induced potential in a light environment.

The thin film transistor of the present disclosure may be a thin film transistor with a top gate structure or a thin film transistor with a bottom gate structure.

The thin film transistor of the present disclosure includes general film settings, e.g., a gate electrode, a gate insulating layer, a semiconductor layer, a source electrode, a drain electrode, and a photoelectric conversion layer in contact with the gate electrode.

The photoelectric conversion layer is arranged on a side of the gate electrode proximate to the light incident side, and configured to generate an induced potential in a light environment. The photoelectric conversion layer generates an induced potential after receiving light, which may compensate the gate electrode for voltage drive. Therefore, in actual operation, only a small voltage supplied from the outside is required to turn on the thin film transistor, and the energy saving effect is remarkable.

Figure 1:
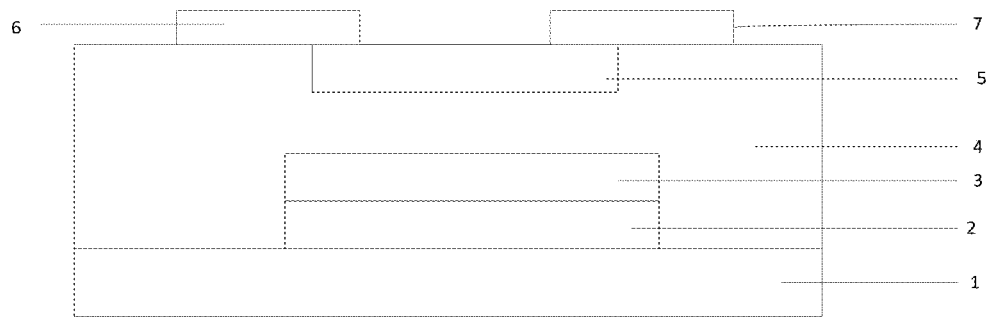
FIG. 1 is a schematic view of a thin film transistor according to one embodiment of the present disclosure.

When the thin film transistor is a thin film transistor with a bottom gate structure, referring specifically to FIG. 1, the thin film transistor shown in FIG. 1 includes a base substrate 1, a photoelectric conversion layer 2 arranged on the base substrate 1, a gate electrode 3 arranged on the photoelectric conversion layer 2, a gate insulating layer 4 arranged on a surface of the gate electrode 3, a semiconductor layer 5 arranged on the gate insulating layer 4, and a source electrode 6 and a drain electrode 7 arranged on the semiconductor layer.

Figure 2:
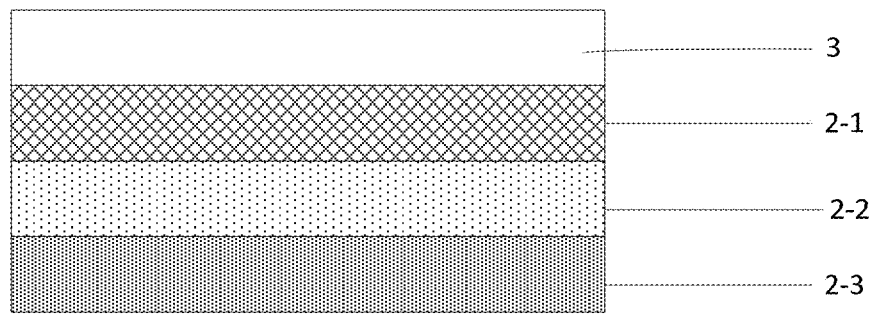
FIG. 2 is a schematic view of a gate electrode and a photoelectric conversion layer of a thin film transistor according to one embodiment of the present disclosure.

Optionally, the photoelectric conversion layer 2 includes a transparent conductive layer 2-3, an electron transport layer 2-2, and a photosensitive layer 2-1 which are arranged in sequence in a direction from the base substrate to the source and drain electrodes, and the photosensitive layer 2-1 is in contact with the gate electrode 3, referring specifically to FIG. 2.

The function of the photosensitive layer is to absorb light to generate an induced potential. The photosensitive layer may have a thickness from 300 nm to 500 nm.

Optionally, the photosensitive layer is formed of a material having a general formula $ABX_3$, in which A is $CH_3NH_3$, B is a metal element, and X is a halogen.

The photosensitive layer material having the above general formula has an organic-inorganic hybrid perovskite structure. In the general formula $ABX_3$, B may be a metal element in group IVA, for example Pb, i.e., the photosensitive layer is made of a material of $CH_3NH_3PbX_3$, in which X is a halogen, for example chlorine, bromine or iodine.

Figure 3:
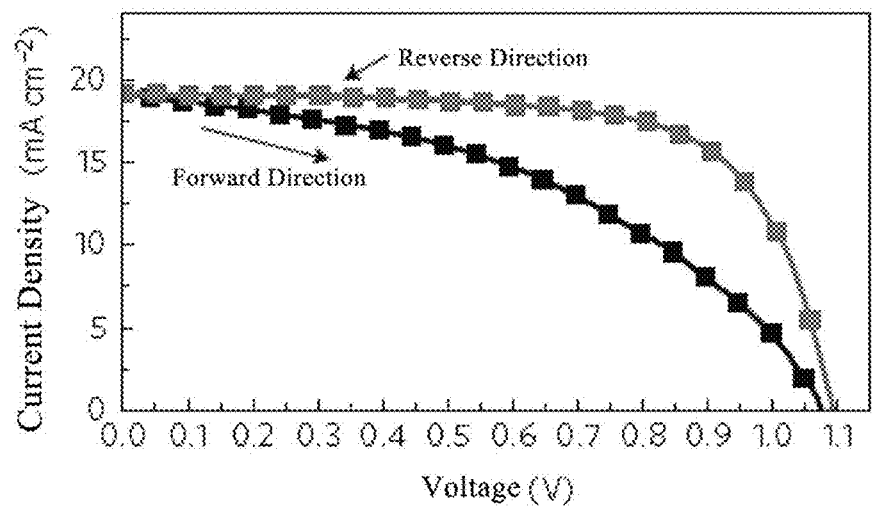
FIG. 3 is a voltammetric graph of a photosensitive layer material of the present disclosure.

FIG. 3 is a voltammetric graph of a photosensitive layer material having the above general formula. As is apparent from FIG. 3, the photosensitive layer material of the above formula has a good light absorbing effect, and is capable of generating an induced potential after receiving light. The specific test process is to apply a voltage in the opposite direction to the photogenerated voltage of the photosensitive layer material having the above general formula, and the applied voltage scans from 0 V to the open circuit voltage (i.e., the maximum photogenerated voltage of the photosensitive layer material having the above general formula), which is the forward scan, and the resulting applied voltages and current curve is the forward curves in FIG. 3. Then, the applied voltage scans from the open circuit voltage to 0V, which is the reverse scan. Since the photosensitive layer material having the above general formula itself has a hysteresis effect, the forward and reverse directions do not completely coincide with each other. Thus, the open circuit voltage of the photosensitive layer material having the above general formula may be obtained as the maximum voltage supplied to the gate electrode.

The function of the electron transport layers is to accelerate the separation of photogenerated electrons and holes. The electron transport layer may have a thickness from 500 nm to 1 µm.

The transparent conductive layer functions electron transport, and may be made of a material of indium tin oxide, indium zinc oxide or the like. The transparent conductive layer may have a thickness from 100 nm to 200 nm.

Figure 4:
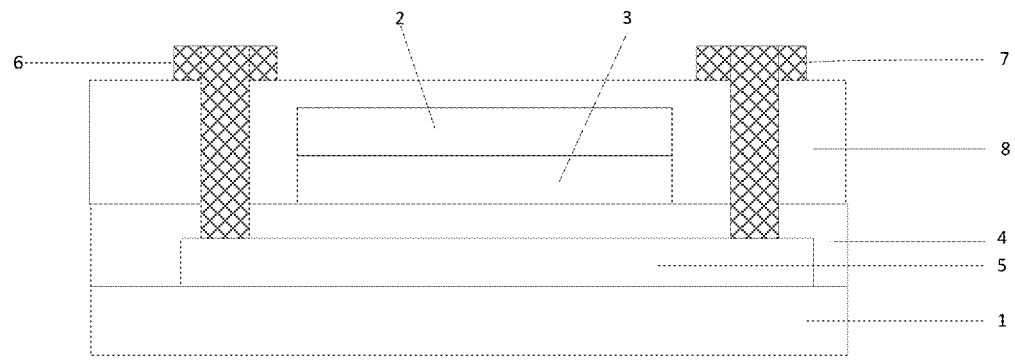
FIG. 4 is a schematic view of a thin film transistor according to another embodiment of the present disclosure.

When the thin film transistor is a thin film transistor with a top gate structure, referring specifically to FIG. 4, the thin film transistor shown in FIG. 4 includes a base substrate 1, a semiconductor layer 5 arranged on the base substrate 1, an insulating layer 4 arranged on the semiconductor layer 5, a gate electrode 3 arranged on the gate insulating layer 4, and a photoelectric conversion layer 2 arranged on the gate electrode 3. Optionally, an interlayer insulating layer 8 is arranged on the photoelectric conversion layer 2, and the source electrode 6 and the drain electrode 7 are arranged on the interlayer insulating layer 8. The source electrode 6 and the drain electrode 7 are connected to the semiconductor layer 5 through via holes.

Figure 5:
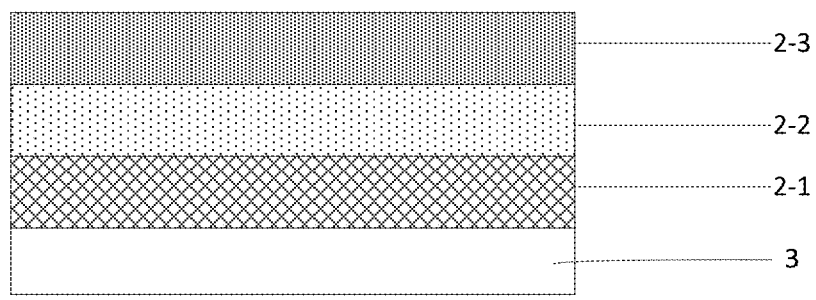
FIG. 5 is a schematic view of a gate electrode and a photoelectric conversion layer of a thin film transistor according to another embodiment of the present disclosure.

Optionally, the photoelectric conversion layer 2 includes a transparent conductive layer 2-3, an electron transport layer 2-2, and a photosensitive layer 2-1 which are arranged in sequence in a direction from the source and drain electrodes to the base substrate, and the photosensitive layer 2-1 is in contact with the gate electrode 3, referring specifically to FIG. 5.

The material and thicknesses used for the transparent conductive layer, the electron transport layer, and the photosensitive layer are the same as the above technical solutions, and thus are not described herein again.

In order to further reduce the voltage supplied from the outside, the gate insulating layer may be made of a material having a larger unit capacitance, so as to turn on the thin film transistor at a lower voltage.

Figure 6:
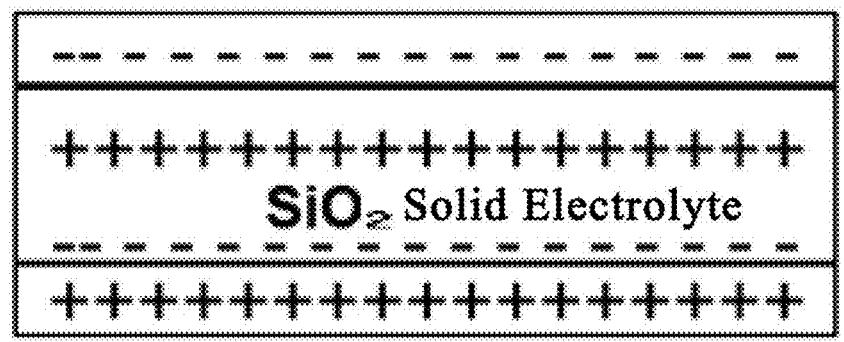
FIG. 6 is a schematic view of an internal ion distribution of a gate insulating layer of the thin film transistor according to one embodiment of the present disclosure driven by voltage.

Optionally, the gate insulating layer has a unit capacitance of above 15 $nF/cm^2$. The gate insulating layer made of a material of a silica solid electrolyte or an alumina solid electrolyte. The silica solid electrolyte has freely moving ions inside, in which the ions directionally migrated under the gate driving voltage, and form a thin capacitor at a interface between the gate insulating layer and the semiconductor layer. As the capacitor becomes thinner, the back channel electrons increase, thereby achieving the effect of turning on the thin film transistor at a lower gate voltage. FIG. 6 shows an internal ion distribution of a silica solid electrolyte driven by voltage.

One embodiment of the present disclosure provides a method for preparing a thin film transistor, including steps of forming a gate electrode, a gate insulating layer, a semiconductor layer, a source electrode, a drain electrode, and a photoelectric conversion layer in contact with the gate electrode on a base substrate.

According to the structure of the thin film transistor, there is a slight difference in the sequence of forming each film layer.

When the thin film transistor is a thin film transistor with a bottom gate structure, the preparation method thereof includes the following steps of: S1: providing a base substrate; S2: forming a photoelectric conversion layer on the base substrate; S3: forming a gate electrode on the base substrate, on which the photoelectric conversion layer is formed, the photoelectric conversion layer being in contact with the gate electrode; S4: forming a gate insulating layer; S5: forming a semiconductor layer; S6: forming a source electrode and a drain electrode.

Optionally, in step S2, the forming the photoelectric conversion layer on the base substrate includes: forming a transparent conductive layer on the base substrate; depositing an electron transport layer on a surface of the transparent conductive layer; forming a photosensitive layer on a surface of the electron transport layer; and patterning the transparent conductive layer, the electron transport layer and the photosensitive layer, to obtain the photoelectric conversion layer.

The function of the photosensitive layer is to absorb light to generate an induced potential. The photosensitive layer may have a thickness from 300 nm to 500 nm. Optionally, the photosensitive layer is made of a material having a general formula $ABX_3$, in which A is $CH_3NH_3$, B is a metal element, and X is a halogen.

The photosensitive layer material having the above general formula has an organic-inorganic hybrid perovskite structure, in which B may be a metal element in group IVA, such as Pb, i.e., the photosensitive layer is made of a material of $CH_3NH_3PbX_3$. X is a halogen, for example chlorine, bromine or iodine.

Optionally, the step of forming the photosensitive layer includes: forming a solution containing a material having a general formula $ABX_3$ on a surface of the electron transport layer through spinning, to obtain the photosensitive layer after drying.

The function of the electron transport layers is to accelerate the separation of photogenerated electrons and holes. The electron transport layer may have a thickness from 500 nm to 1 μm.

The transparent conductive layer functions electron transport, and may be made of a material of indium tin oxide, indium zinc oxide or the like. The transparent conductive layer may have a thickness from 100 nm to 200 nm.

In step S3, the gate electrode may be made of a material of metals, such as Cu, Al, Ag, Mo, Cr, Nd, Ni, Mn, Ti, Ta or W, or alloys of these metals.

The forming the gate electrode on the base substrate is specifically shown as follows: a gate metal layer is deposited on the photoelectric conversion layer, and the gate metal layer is patterned to obtain the gate electrode.

When the photoelectric conversion layer includes a transparent conductive layer, an electron transport layer, and a photosensitive layer, the forming the gate electrode on the base substrate is shown as follows: a gate metal layer is deposited on the base substrate, on which the photosensitive layer is formed, and the gate metal layer is patterned to obtain the gate electrode.

A patterning process may be performed in accordance with, but is not limited to the following methods:

A layer of photoresist is coated on the gate metal layer, and the photoresist is exposed through using a mask to form a photoresist unreserved region and a photoresist reserved region, in which the photoresist reserved region corresponds to a region in which the pattern of the gate electrode is located, and the photoresist unreserved region corresponds to a region outside of the above pattern; development processing is performed, so that the photoresist in the photoresist unreserved region is completely removed, and the thickness of the photoresist in the photoresist reserved region remains unchanged; and the gate metal layer in the photoresist unreserved region is completely etched away through an etching process; and the remaining photoresist is stripped to form a pattern of the gate layer.

In step S4, the forming the gate insulating layer is specifically as follows: forming the gate insulating layer on the base substrate, on which the gate electrode is formed In order to further reduce the voltage supplied from the outside, the gate insulating layer may be made of a material having a larger unit capacitance, so as to turn on the thin film transistor at a lower voltage.

Optionally, the gate insulating layer has a unit capacitance of above 15 $nF/cm^2$. The gate insulating layer is made of a silica solid electrolyte or an alumina solid electrolyte. The silica solid electrolyte has freely moving ions inside, in which the ions directionally migrated under the gate driving voltage, and form a thin capacitor at an interface between the gate insulating layer and the semiconductor layer. As the capacitor becomes thinner, the back channel electrons increase, thereby achieving the effect of turning on the thin film transistor at a lower gate voltage.

The gate insulating layer may be made of a silicon dioxide solid electrolyte, and the step of forming the gate insulating layer includes: depositing a silicon dioxide solid electrolyte on the base substrate, on which the gate electrode is formed, through vapor deposition, to obtain the gate insulating layer.

In the vapor deposition, a gas flow ratio of $SiH_4$ to $O_2$ is from 1:4 to 1:5.

In step S5, the forming the semiconductor layer is specifically as follows: forming the semiconductor layer on the base substrate, on which the gate insulating layer is formed.

The semiconductor layer are made of a material of a-Si, LTPS, IGZO and the like.

The forming the semiconductor layer on the gate insulating layer may as follows: depositing a semiconductor thin film on the base substrate, on which the gate insulating layer is formed, to obtain the semiconductor layer after a patterning process.

In step S6, the source electrode and the drain electrode may be made of a metal including Al, Cu, Ti, Cr, or the like.

The forming the source electrode and the drain electrode may be as follows: depositing a source electrode layer and a drain electrode layer, to form the source electrode and the drain electrode after a patterning process.

Optionally, the source electrode and the drain electrode are arranged on the semiconductor layer to minimize the parasitic capacitance.

After preparing the source electrode and drain electrode, the thin film transistor is obtained.

When the thin film transistor is a thin film transistor with a top gate structure, the preparation method thereof specifically includes the following steps: S1': providing a base substrate; S2': forming a semiconductor layer; S3': forming a gate insulating layer; S4', forming a gate electrode; S5', forming a photoelectric conversion layer, wherein the photoelectric conversion layer is in contact with the gate electrode; S6', forming an interlayer insulating layer; and S7', forming a source electrode and a drain electrodeconnected to the semiconductor layer, respectively.

In step S2', the forming the semiconductor layer is specifically forming the semiconductor layer on the base substrate.

The semiconductor layer may be made of a material of a-Si, LTPS, IGZO and the like.

A method for forming the semiconductor layer on the base substrate may be depositing a semiconductor thin film on the base substrate, to obtain the semiconductor layer after a patterning process.

In step S3', the forming the gate insulating layer is specifically forming the gate insulating layer on the base substrate, on which the semiconductor layer is formed.

In order to further reduce the voltage supplied from the outside, the gate insulating layer may be made of a material having a larger unit capacitance, so as to turn on the thin film transistor at a lower voltage.

Optionally, the gate insulating layer has a unit capacitance of above 15 nF/cm$^2$. The gate insulating layer is made of a silica solid electrolyte or an alumina solid electrolyte. The silica solid electrolyte has freely moving ions inside, in which the ions directionally migrated under the gate driving voltage, to form a thin capacitor at an interface between the gate insulating layer and the semiconductor layer. As the capacitor becomes thinner, the back channel electrons increase, thereby achieving the effect of turning on the thin film transistor at a lower gate voltage.

The gate insulating layer may be made of a silicon dioxide solid electrolyte. The forming the gate insulating layer includes: depositing a silicon dioxide solid electrolyte on the base substrate, on which the semiconductor layer is formed, through vapor deposition, to obtain the gate insulating layer.

In the vapor deposition, a gas flow ratio of $SiH_4$ to $O_2$ is from 1:4 to 1:5.

In step S4', the forming the gate electrode is specifically as follows: a gate metal layer having a thickness of about 500 to 4,000 Å may be deposited on the substrate, in which the step S3' is completed, through sputtering or thermal evaporation. The gate metal layer may be a metal, such as Cu, Al, Ag, Mo, Cr, Nd, Ni, Mn, Ti, Ta and W, and alloys of these metals. The gate metal layer may be a single layer structure or a multilayer structure. The multilayer structure is for example Cu\Mo, Ti\Cu\Ti, Mo\Al\Mo, etc. A layer of photoresist is coated on the gate metal layer, and the photoresist is exposed through using a mask to form a photoresist unreserved region and a photoresist reserved region, in which the photoresist reserved region corresponds to a region in which the pattern of the gate electrode is located, and the photoresist unreserved region corresponds to a region outside of the above pattern. Then, development processing is performed, so that the photoresist in the photoresist unreserved region is completely removed, and the thickness of the photoresist in the photoresist reserved region remains unchanged. Finally, the gate metal layer of the photoresist unreserved region is completely etched away through an etching process, and the remaining photoresist is stripped to form a pattern of the gate layer.

In step S5', the forming the photoelectric conversion layer specifically includes: forming a photosensitive layer on a surface of the gate electrode; depositing an electron transport layer on a surface of the photosensitive layer; depositing a transparent conductive layer on a surface of the electron transport layer; and patterning the transparent conductive layer, the electron transport layer and the photosensitive layer, to obtain the photoelectric conversion layer.

The materials and thicknesses of the transparent conductive layer, the electron transport layer and the photosensitive layer have been clearly described in the above technical solutions, and thus are not described herein again.

In step S6', the forming an interlayer insulating layer is specifically as follows: an interlayer insulating layer may be deposited on the photoelectric conversion layer formed in the step S5' through a plasma enhanced chemical vapor deposition (PECVD) method.

In step S7', the source electrode and the drain electrode may be made of a metal including Al, Cu, Ti, Cr, or the like.

The forming the source electrode and the drain electrode may include: forming via holes on the interlayer insulating layer and the gate insulating layer, depositing a source and drain electrode metal in the holes, respectively, and forming the source and the drain after a patterning process.

After forming the source electrode and drain electrode, the thin film transistor is obtained.

One embodiment of the present disclosure also provides a display device including the thin film transistor described in the above technical solutions.

The display device may be a display substrate or a display device. The display device may include any product or component having a display function, such as a liquid crystal television, a liquid crystal display, a digital photo frame, a mobile phone, a tablet computer, etc.

A liquid crystal display device including a thin film transistor according to one embodiment of the present disclosure may be used for the display of a strip two-dimensional code. When the backlight is turned on, all the gate electrodes are turned on due to the voltage generated by the photoelectric conversion layer, and the corresponding pixel electrode may be driven to cause the display device to display bright and dark stripes by controlling the voltage signal input to the source, thereby achieving the purpose for the display of a strip two-dimensional code.

Through using the thin film transistor provided by the embodiments of the present disclosure, the steps of preparing the driving signal line may be omitted, thereby optimizing the manufacturing process and the device structure, and thus reducing the production cost.

As compared with related art, the thin film transistor of the present disclosure includes a photoelectric conversion layer in contact with the gate electrode, wherein the photoelectric conversion layer is configured to generate an induced potential in a light environment. In the present disclosure, the photoelectric conversion layer generates an induced potential after receiving light, which may compensate the gate electrode for voltage drive. Therefore, in actual operation, only a small voltage supplied from the outside is required to turn on the thin film transistor, and the energy saving effect is remarkable. When the thin film transistor is used for a display device, the power consumption of the display device may be reduced, thereby achieving a higher energy efficiency ratio.

The description of the above embodiments is merely used for helping to understand the method according to the present disclosure and its core idea. It should be noted that a person skilled in the art may make further improvements and modifications to the disclosure without departing from the principle/spirit of the present disclosure, and these improvements and modifications shall also fall within the scope of the present disclosure.

The above description of the disclosed embodiments allows one skilled in the art to implement or use the present disclosure. Various modifications to these embodiments would be apparent to one skilled in the art, and the general principles defined herein may be applied to other embodiments without departing from the spirit or scope of the disclosure. Therefore, the present disclosure will not be limited to the embodiments shown herein, but should conform to the widest scope consistent with the principles and novel features disclosed herein.

What is claimed is:

1. A thin film transistor comprising:
   a gate electrode;
   a gate insulating layer;
   a semiconductor layer;
   a source electrode;
   a drain electrode; and
   a photoelectric conversion layer in contact with the gate electrode,
   wherein the photoelectric conversion layer is configured to generate an induced potential in a light environment; and
   wherein the thin film transistor further comprises an interlayer insulating layer arranged on the photoelectric conversion layer, the source electrode and the drain electrode being arranged on the interlayer insulating layer.

2. The thin film transistor of claim 1, wherein the thin film transistor is a thin film transistor with a bottom gate structure, and the photoelectric conversion layer comprises a transparent conductive layer, an electron transport layer, and a photosensitive layer which are arranged in sequence, and the photosensitive layer is in contact with the gate electrode.

3. The thin film transistor of claim 1, wherein the thin film transistor is a thin film transistor with a top gate structure, and the photoelectric conversion layer comprises a photosensitive layer, an electron transport layer, and a transparent conductive layer which are arranged in sequence, and the photosensitive layer is in contact with the gate electrode.

4. The thin film transistor of claim 2, wherein the photosensitive layer is made of a material having a general formula $ABX_3$, in which A is $CH_3NH_3$, B is a metal element, and X is a halogen.

5. The thin film transistor of claim 2, wherein the photosensitive layer is made of a material having a general formula $ABX_3$, in which A is $CH_3NH_3$, B is a metal element in group IVA, and X is a halogen.

6. The thin film transistor of claim 2, wherein the photosensitive layer is made of a material having a general formula $CH_3NH_3PbX_3$, in which X is a halogen.

7. The thin film transistor of claim 1, wherein the gate insulating layer has a unit capacitance of above 15 $nF/cm^2$.

8. The thin film transistor of claim 7, wherein the gate insulating layer is made of a silica solid electrolyte or an alumina solid electrolyte.

9. The thin film transistor of claim 2, wherein the photosensitive layer has a thickness of 300 nm to 500 nm, the electron transport layer has a thickness of 500 nm to 1 µm, and the transparent conductive layer has a thickness of 100 nm to 200 nm.

10. A method for preparing a thin film transistor, comprising steps of:
    forming a gate electrode,
    forming a gate insulating layer,
    forming a semiconductor layer,
    forming an interlayer insulating layer,
    forming a source electrode and a drain electrode, and
    forming a photoelectric conversion layer in contact with the gate electrode on a base substrate,
    wherein the interlayer insulating layer is arranged on the photoelectric conversion layer, and the source electrode and the drain electrode are arranged on the interlayer insulating layer.

11. The method of claim 10, wherein the thin film transistor is a thin film transistor with a bottom gate structure, and the step of forming the photoelectric conversion layer in contact with the gate electrode comprises:
    forming a transparent conductive layer on the base substrate;
    depositing an electron transport layer on a surface of the transparent conductive layer;
    forming a photosensitive layer on a surface of the electron transport layer; and
    patterning the transparent conductive layer, the electron transport layer and the photosensitive layer, to obtain the photoelectric conversion layer.

12. The method of claim 10, wherein the thin film transistor is a thin film transistor with a top gate structure, and the step of forming the photoelectric conversion layer in contact with the gate electrode comprises:
    forming a photosensitive layer on a surface of the gate electrode;
    depositing an electron transport layer on a surface of the photosensitive layer;
    depositing a transparent conductive layer on a surface of the electron transport layer; and
    patterning the transparent conductive layer, the electron transport layer and the photosensitive layer, to obtain the photoelectric conversion layer.

13. The method of claim 11, wherein the step of forming the photosensitive layer comprises:
    forming a solution containing a material having a general formula $ABX_3$ on a surface of the electron transport layer through spinning, to obtain the photosensitive layer after drying, wherein A is $CH_3NH_3$, B is a metal element, and X is a halogen.

14. The method of claim 11, wherein the step of forming the photosensitive layer comprises:
    forming a solution containing a material having a general formula $ABX_3$ on a surface of the electron transport layer through spinning, to obtain the photosensitive layer after drying, wherein A is $CH_3NH_3$, B is a metal element in group IVA, and X is a halogen.

15. The method of claim 11, wherein the step of forming the photosensitive layer comprises:

forming a solution containing a material having a general formula $ABX_3$ on a surface of the electron transport layer through spinning, to obtain the photosensitive layer after drying, wherein A is $CH_3NH_3$, B is Pb, and X is a halogen.

16. The method of claim 12, wherein the step of forming the photosensitive layer comprises:

forming a solution containing a material having a general formula $ABX_3$ on a surface of the gate electrode through spinning, to obtain the photosensitive layer after drying, wherein A is $CH_3NH_3$, B is a metal element, and X is a halogen.

17. The method of claim 12, wherein the step of forming the photosensitive layer comprises:

forming a solution containing a material having a general formula $ABX_3$ on a surface of the gate electrode through spinning, to obtain the photosensitive layer after drying, wherein A is $CH_3NH_3$, B is a metal element in group IVA, and X is a halogen.

18. The method of claim 10, wherein the step of forming the gate insulating layer comprises:

depositing a silicon dioxide solid electrolyte on the base substrate, on which the gate electrode or the semiconductor layer is formed, through vapor deposition, to obtain the gate insulating layer, and in the vapor deposition, a gas flow ratio of $SiH_4$ to $O_2$ is from 1:4 to 1:5.

19. A display device, comprising the thin film transistor of claim 1.

* * * * *